United States Patent
Schwarz (10) Patent No.: US 10,861,837 B2
(45) Date of Patent: Dec. 8, 2020

(54) VIDEO-WALL MODULE WITH DIFFERENT LIGHT-EMITTING DIODE CHIPS ARRANGED IN DIFFERENT AREAS

(71) Applicant: OSRAM Opto Semiconductors GmbH, Regensburg (DE)

(72) Inventor: Thomas Schwarz, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/467,480

(22) PCT Filed: Dec. 19, 2017

(86) PCT No.: PCT/EP2017/083516
§ 371 (c)(1),
(2) Date: Jun. 6, 2019

(87) PCT Pub. No.: WO2018/114931
PCT Pub. Date: Jun. 28, 2018

(65) Prior Publication Data
US 2019/0326269 A1     Oct. 24, 2019

(30) Foreign Application Priority Data

Dec. 20, 2016    (DE) .................. 10 2016 124 983

(51) Int. Cl.
*H01L 25/16*    (2006.01)
*H01L 25/075*    (2006.01)
(Continued)

(52) U.S. Cl.
CPC .......... *H01L 25/167* (2013.01); *G09F 9/3026* (2013.01); *H01L 25/0753* (2013.01);
(Continued)

(58) Field of Classification Search
CPC ....... H01L 2224/48091; H01L 25/0753; H01L 2924/00014; H01L 33/642;
(Continued)

(56) References Cited

U.S. PATENT DOCUMENTS 8,174,197 B2    5/2012  Ghanem et al.
2003/0025657 A1    2/2003  Iwafuchi
(Continued)

FOREIGN PATENT DOCUMENTS

DE    10008203 A1    8/2001
EP    0933753 A2    8/1999
(Continued)

*Primary Examiner* — Duy T Nguyen
(74) *Attorney, Agent, or Firm* — Slater Matsil, LLP (57) ABSTRACT

A video-wall module is disclosed. In an embodiment a video-wall module includes a printed-circuit board, a plurality of light-emitting diode chips arranged at the printed-circuit board, a circuit chip fixed to the printed-circuit board, wherein the circuit chip is connected with electrical connections of the light-emitting diode chips in order to electrically actuate the light-emitting diode chips and a housing for the circuit chip at least partially formed by the printed circuit board, wherein the light-emitting diode chips are divided into a first area and a first edge area surrounding the first area, and wherein the light-emitting diode chips in the first area comprise a smaller radiation wavelength than the light-emitting diode chips in the first edge area on average at the same temperature.

20 Claims, 8 Drawing Sheets

(51) Int. Cl.
*H01L 33/62* (2010.01)
*H01L 33/64* (2010.01)
*G09F 9/302* (2006.01)
*G09G 3/32* (2016.01)

(52) U.S. Cl.
CPC ............ *H01L 33/62* (2013.01); *H01L 33/645* (2013.01); *H01L 33/647* (2013.01); *G09G 3/32* (2013.01); *G09G 2300/026* (2013.01)

(58) Field of Classification Search
CPC . H01L 2224/32188; H01L 2224/48227; H01L 25/167; H01L 33/62; H01L 33/645; H01L 33/647
USPC .......................................................... 257/89
See application file for complete search history.

(56) References Cited

U.S. PATENT DOCUMENTS

| | | | |
|---|---|---|---|
| 2006/0145331 A1 | 7/2006 | Cho et al. | |
| 2010/0259920 A1 | 10/2010 | Lin | |
| 2011/0176280 A1* | 7/2011 | Lee ........................ | H01L 25/16 361/721 |
| 2013/0119535 A1 | 5/2013 | Joshi | |
| 2014/0232259 A1* | 8/2014 | Kawashima ........... | H05B 45/00 313/512 |
| 2016/0150683 A1 | 5/2016 | Sagerian et al. | |

FOREIGN PATENT DOCUMENTS

| | | |
|---|---|---|
| EP | 2239997 A1 | 10/2010 |
| WO | 0247310 A2 | 6/2002 |
| WO | 2015162023 A1 | 10/2015 |

* cited by examiner

VIDEO-WALL MODULE WITH DIFFERENT LIGHT-EMITTING DIODE CHIPS ARRANGED IN DIFFERENT AREAS

This patent application is a national phase filing under section 371 of PCT/EP2017/083516, filed Dec. 19, 2017, which claims the priority of German patent application 102016124983.1, filed Dec. 20, 2016, each of which is incorporated herein by reference in its entirety.

TECHNICAL FIELD

The present invention relates to a video-wall module.

BACKGROUND

The prior art provides video-wall modules comprising light-emitting diode chips.

SUMMARY OF THE INVENTION

Embodiments provide a compactly designed video-wall module. The proposed video-wall module may comprise light-emitting diode chips the pixel size of which is in particular smaller than 2 mm.

Embodiments provide a video-wall module having a plurality of light-emitting diode chips, wherein the light-emitting diode chips are arranged at a printed-circuit board, wherein a circuit chip is fixed to the printed-circuit board, wherein the circuit chip is connected with electrical connections of the light-emitting diode chips in order to electrically actuate the light-emitting diode chips, wherein a housing for the circuit chip is at least partially formed by the printed-circuit board. The term "circuit chip" relates to electrical and electronical circuits that comprise a layer structure of semiconducting layers. The circuit chip may, e.g., comprise an integrated circuit. The circuit chip may be embodied to provide a current supply for the light-emitting diode chips. Moreover, the circuit chip may be embodied to allow for a control of the electrical current supply of the light-emitting diode chips. For example, the circuit chip may comprise a multiplexer circuit for individually actuating the individual light-emitting diode chips or current-supply circuits in order to supply the light-emitting diode chips.

The proposed video-wall module has the advantage that circuit chips are integrated into the printed-circuit board. This advantage is achieved by the fact that the circuit chip comprises a housing that is at least partially formed by the printed-circuit board. Depending on the chosen embodiment, the circuit chip may be directly integrated in the printed-circuit board. In this way, the printed-circuit board forms the housing for the circuit chip.

In an embodiment, the circuit chip is fixed to a bottom face of the printed-circuit board, the circuit chip being covered by a coating. In this embodiment, the bottom face of the printed-circuit board and the coating form the housing for the circuit chip.

In an embodiment, the circuit chip is arranged in the printed-circuit board, the printed-circuit board forming the housing for the circuit chip. In this way, a low design is achieved. In addition, the circuit chip is very well protected against environmental influences.

In an embodiment, the printed-circuit board comprises a thermally conductive layer at a bottom face in order to dissipate heat from the circuit chip. Hereby, waste heat, particularly from the circuit chip, may efficiently be dissipated without the necessity of significantly enlarging the design.

In an embodiment, a frame is arranged on the bottom face of the printed-circuit board wherein the frame surrounds an inner face of the bottom face, wherein the circuit chip is arranged on the inner face, wherein the inner face is filled with a casting or molding material, wherein the casting or molding material form the coating. The frame may be formed of a more stable material. In addition, the casting or molding material may have a higher thermal conductivity than the material of the frame.

In an embodiment, the printed-circuit board comprises four edges, wherein the first edge is arranged opposite to the second edge, wherein the coating extends from the first edge to the second edge in the shape of a strip. By means of this form of coating, the production of the video-wall module may be simplified.

In an embodiment, the bottom face of the printed-circuit board is covered by the coating, wherein electrical contact elements of the printed-circuit board protrude from the coating, thus achieving a safe covering of the circuit chip. In addition, the thermal coating may have a higher thermal conductivity than the printed-circuit board.

Depending on the chosen embodiment, the coating may be deposited as a casting or molding material or as a film. The film allows for a clearly defined geometry of the coating. In addition, recesses for the contact surfaces or contact elements may be provided. This reliably prevents a covering of the contact surfaces and/or of the contact elements by the coating.

In an embodiment, the circuit chip is mounted on a bottom face of the printed-circuit board in a flip-chip assembly, wherein electrical contacts of the circuit chip are connected with electrical contacts of the printed-circuit board via contact elements, and wherein a thermally conductive layer is arranged between the circuit chip and the bottom face of the printed-circuit board. This allows for a good mechanical and thermal coupling between the circuit chip and the printed-circuit board. In addition, the design is low and robust as no contact wires are used.

In an embodiment, electrical contacts of the bottom face of the printed-circuit board are connected via contact elements with further electrical contacts of a further printed-circuit board, a second thermally conductive layer being arranged between the printed-circuit board and the further printed-circuit board. Thereby, a good mechanical and thermal connection of the video-wall module with the further printed-circuit board is achieved.

In an embodiment, a thermally conductive intermediate layer is arranged in the printed-circuit board, wherein the circuit chip arranged in the printed-circuit board is thermally coupled with the intermediate layer, wherein thermally conducting through-contacts are provided in the printed-circuit board, wherein the through-contacts are guided from the intermediate layer to the bottom face of the printed-circuit board. Thereby, the thermal conductivity of the printed-circuit board is improved.

In an embodiment, the intermediate layer has a larger area than the circuit chip.

Thereby, improved heat dissipation from the circuit chip is achieved.

In an embodiment, the printed-circuit board comprises a thermally conducting conductor surface at its bottom face, wherein in particular an area of the conductor surface is larger than the area of the circuit chip. This improves heat dissipation.

In another embodiment, the printed-circuit board comprises a conductor surface on its bottom face, wherein the circuit chip is arranged on the conductor surface, wherein at least two conductor lines are guided from the conductor surface to an edge area of the printed-circuit board's bottom face, wherein one of the conductor lines is respectively connected to an electrical contact of the printed-circuit board, wherein the electrical contacts are arranged on the bottom face of the printed-circuit board, thus balancing temperature differences.

In another embodiment, the conductor lines originate from faces of the conductor surface arranged opposite to one another, the two conductor lines being guided to electrical contact surfaces and/or contact elements at opposite edges of the printed-circuit board. This further improves temperature balance.

In an embodiment, the light-emitting diode chips are divided up into a first area and into a first edge area surrounding the first area, wherein in the first area the light-emitting diode chips—at the same temperature, in particular at room temperature—on average comprise a smaller radiation wavelength than the light-emitting diode chips in the first edge area. As a result, wavelength shifts generated by differing temperatures at the light-emitting diode chips may be reduced or balanced. This achieves a more unified total wavelength spectrum.

In another embodiment, a second edge area is provided, the second edge area surrounding the first edge area, wherein in the first edge area the light-emitting diode chips—at the same temperature, in particular at room temperature—on average comprise a smaller radiation wavelength than the light-emitting diode chips in the second edge area. Thereby, wavelength shifts caused by differing temperatures at the light-emitting diode chips may be reduced or balanced with more precision. This achieves a more unified total wavelength spectrum. More areas and edge areas provide more precision in balancing out the temperature differences.

In another embodiment, the light-emitting diode chips emitting light of the same color on average comprise a smaller radiation wavelength in the first area than in the first edge area. As a result, a higher homogeneity of color may be achieved. The light-emitting diode chips may emit red light and/or blue light and/or green light.

In an embodiment, the printed-circuit board comprises a controllable thermal element, wherein the thermal element is configured to increase or reduce a temperature of the printed-circuit board in a predetermined region in order to balance temperature differences on the printed-circuit board that are in particular generated by waste heat of the circuit chip. This may provide an improved temperature balance. The thermal element may be configured as a controllable heat sink in order to reduce a temperature of the printed-circuit board in a predetermined region.

In addition, the printed-circuit board may comprise a controllable heat source as a thermal element in order to increase a temperature of the printed-circuit board in a predetermined region.

BRIEF DESCRIPTION OF THE DRAWINGS

The above-described properties, features and advantages of the present invention as well as the manner in which they are achieved will become clearer in context with the following description of embodiment examples which will be explained in more detail in conjunction with the drawings. The respective schematic views show.

DETAILED DESCRIPTION OF ILLUSTRATIVE EMBODIMENTS

Figure 1:
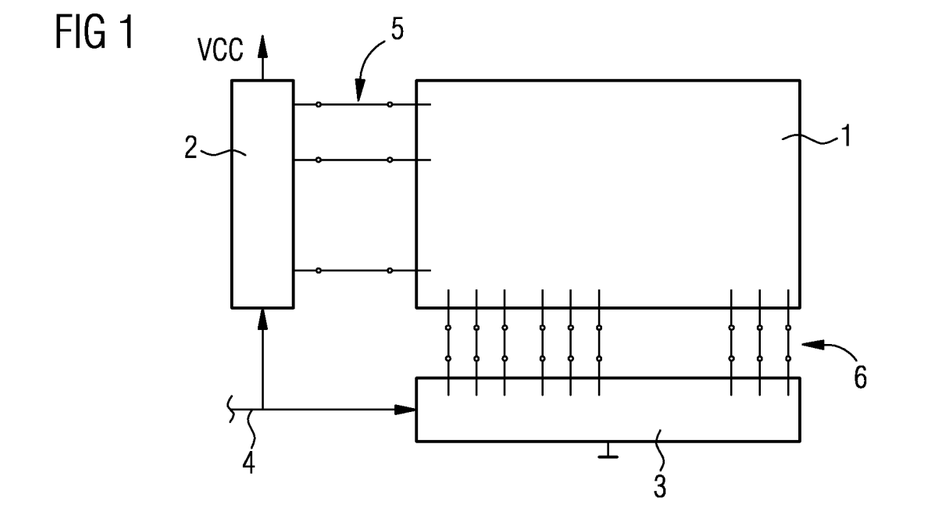
FIG. 1 shows a schematic view of an electrical circuit for operating a video-wall module.

FIG. 1 shows a schematic view of an electrical circuitry of a video-wall module 1. The video-wall module 1 comprises a plurality of light-emitting diode chips in a crossed-matrix circuitry that are not depicted herein. A multiplexer circuit 2 is provided to electrically actuate the light-emitting diode chips of the video-wall module 1. In addition, a current-supply circuit 3 is provided. The multiplexer circuit and the current-supply circuit are provided, via data lines 4, with control data that determine a desired actuation of the light-emitting diode chips. The multiplexer circuit 2 is in contact with the control circuits via control lines 5 in order to supply predetermined light-emitting diode chips with current. The current supply is guided from the current-supply circuit 3 to the control circuits via supply lines 6.

The multiplexer circuit 2 and the current-supply circuit 3 may each be configured as circuit chips. The circuit chip may comprise integrated circuits as well as discrete components. Depending on the used embodiment, the multiplexer circuit 2 as well as the current-supply circuit 3 may be integrated in one single circuit chip. In addition, a circuit chip may also comprise other or further electrical and/or electronical circuits that may be used to operate the video-wall module 1. Depending on the chosen embodiment, the circuit chip may comprise a constant-current-source array as well as a shift register.

Figure 2:
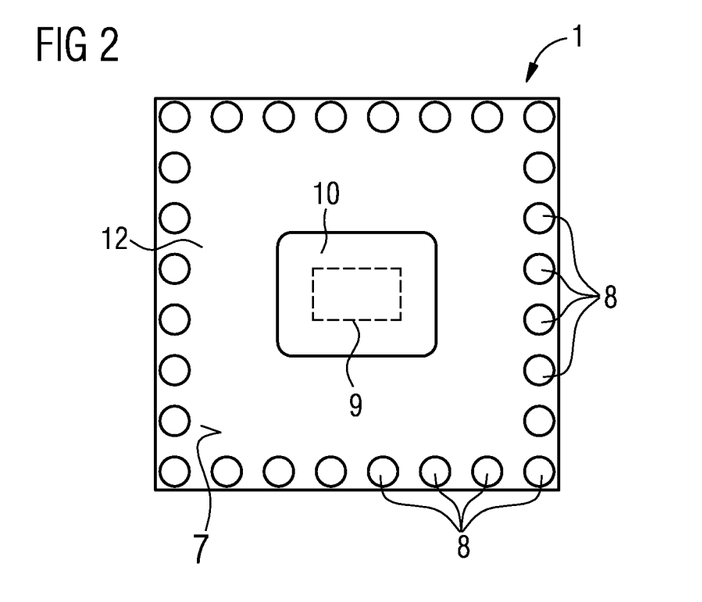
FIG. 2 shows a schematic view of a bottom face of a video-wall module having a circuit chip at the bottom face.

FIG. 2 depicts a schematic view of a bottom face 7 of a video-wall module 1. The depicted video-wall module 1 comprises a square printed-circuit board 12. In the edge area of the bottom face 7 of the printed-circuit board 12 of the video-wall module 1, electrical contact elements 8 are arranged, which are located on electrical contact surfaces. In the shown embodiment example, the electrical contact elements 8 are arranged alongside of four side edges of the printed-circuit board's 12 bottom side 7 in a circumferential manner. The electrical contact elements 8 may, e.g., be in the shape of contact balls. For example, the electrical contact elements 8 may have a diameter of 1 mm. In addition, two electrical contact elements 8 may have a lateral distance of 2 mm. Furthermore, a lateral length of the video-wall module 1 may, e.g., be 15 mm. On the bottom face 7 of the printed-circuit board 12, a circuit chip 9 is arranged. The circuit chip 9 abuts on a face of the printed-circuit board 12. The other faces of the circuit chip 9 are covered with a coating 10. The circuit chip 9 is schematically depicted as dashed lines because the coating 10 covers the entire circuit chip 9. The circuit chip 9 comprises a semiconductor layer with an integrated circuit. The integrated circuit may be configured to carry out electrical and/or electronical functions. The integrated circuit may be configured as a multiplexer circuit and/or a current-supply circuit. The circuit chip 9 may comprise a carrier; however, it is configured without a housing.

The coating 10 may consist of an electrically insulating material, in particular of plastic or of a molding material or of a casting material. The depiction of FIG. 2 is only schematic, wherein electrical conductors provided between the circuit chip 9 and the electrical contact elements 8 are not depicted. The electrical conductors may be configured as conductor lines or conducting wires. The printed-circuit board 12 and the coating 10 form a housing for the circuit chip 9. The printed-circuit board 12 may consist of any desired materials or comprise corresponding materials. For example, the printed-circuit board may consist of a printed-circuit-board material. In particular, the printed-circuit board 12 may be a multi-layer printed-circuit board and/or comprise electrical through-contacts. Moreover, the printed-circuit board 12 may comprise ceramics or be made of ceramics.

Figure 3:
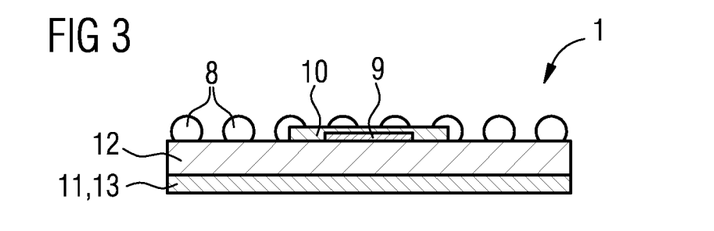
FIG. 3 shows a cross-sectional view of the arrangement of FIG. 2.

FIG. 3 shows a cross-sectional view of the arrangement of FIG. 2. The printed-circuit board 12 has a front face 11 on which light-emitting diode chips 13 are arranged. The circuit chip 9 is arranged opposite to the light-emitting diode chips 13 on the printed-circuit board 12. With a bottom face, the circuit chip 9 adjoins the printed-circuit board 12. An upper face and side faces of the circuit chip 9 are covered by the coating 10. The coating 10 and hence the circuit chip 9 in this example have a thickness which is lower than the height of the electrical contact elements 8. By means of this arrangement, a video-wall module 1 with a circuit chip 9 is provided that has a lower construction height. In addition, the circuitry involved in connecting the video-wall module 1 is reduced as the circuit chip 9 is already electrically coupled with the light-emitting diode chips 13. Depending on the used embodiment, a switch may be provided for each light-emitting diode chip 13 on the front side 11 in order to individually supply each light-emitting diode chip 13 with current. The circuit chip 9 may comprise the multiplexer for selecting the light-emitting diode chip 13 to be actuated and/or the current-supply circuit for this or for each light-emitting diode chip 13. As a result, the amount of contacting and circuitry necessary for the video-wall module 1 is reduced.

Figure 4:
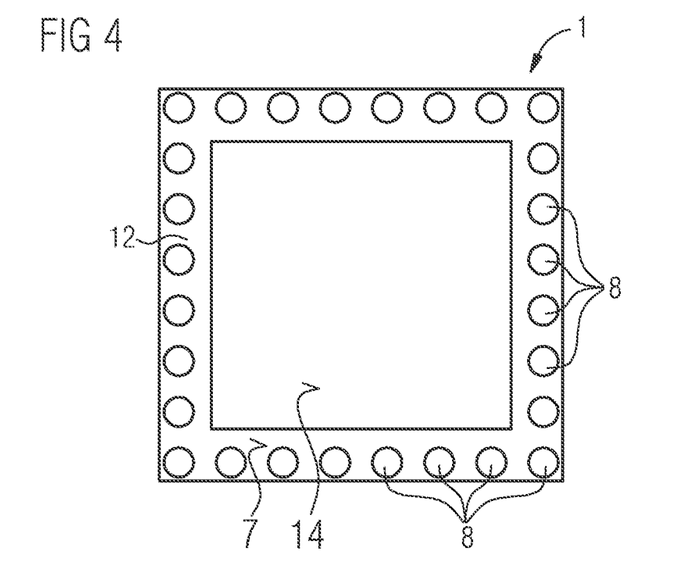
FIG. 4 shows a top view of the video-wall module having a circuit chip arranged in a printed-circuit board.

FIG. 4 shows a bottom face 7 of a printed-circuit board 12 of a further video-wall module 1. In this embodiment, as well, the electrical contact elements 8 are arranged in a circumferential manner in edge areas of the bottom face 7 of the printed-circuit board 12. In addition, a thermally conducting conductor surface 14 is provided on the bottom face 7. The conductor surface 14 is made of a material with good thermal conductivity, e.g., a metal. The conductor surface 14 may, e.g., comprise copper or consist of copper. The larger the conductor surface 14 is, the lower will the temperature increase of the video-wall module 1 be. However, an electrical connection with the electrical contact elements 8 is to be avoided.

Figure 5:
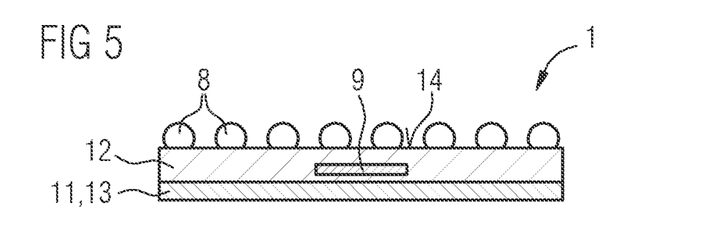
FIG. 5 shows a cross-sectional view of the video-wall module of FIG. 4.

FIG. 5 shows a cross-sectional view of the video-wall module 1 of FIG. 4. The printed-circuit board 12 comprises a front face 11 on which the light-emitting diode chips 13 are arranged. In this embodiment, the circuit chip 9 is integrated in the printed-circuit board 12. Depending on the used embodiment, a switch may be provided for each light-emitting diode chip 13 on the front face 11 in order to individually supply current to each light-emitting diode chip 13. The circuit chip 9 may comprise the multiplexer for selecting the light-emitting diode chip 13 to be actuated and/or the current-supply circuit for this or for each light-emitting diode chip 13.

As the circuit chip 9 is arranged in the printed-circuit board 12, essentially the entire bottom face 7, apart from the areas in which the electrical contact elements 8 are arranged, may be used for configuring the conductor surface 14. The printed-circuit board 12 may consist of any desired material or comprise such materials. For example, the printed-circuit board 12 may consist of a printed-circuit-board material. The printed-circuit board 12 may particularly be a multi-layer printed-circuit board and/or comprise electrical through-contacts. Moreover, the printed-circuit board 12 may comprise ceramics or be made of ceramics.

The conductor surface 14 may, e.g., have a thickness that corresponds to a range of up to 10% or more of the thickness of the printed-circuit board 12. The thicker the conductor surface 14 is, the better heat may be dissipated from the circuit chip. This is particularly true when the printed-circuit board 14 is formed of metal.

Figure 6:
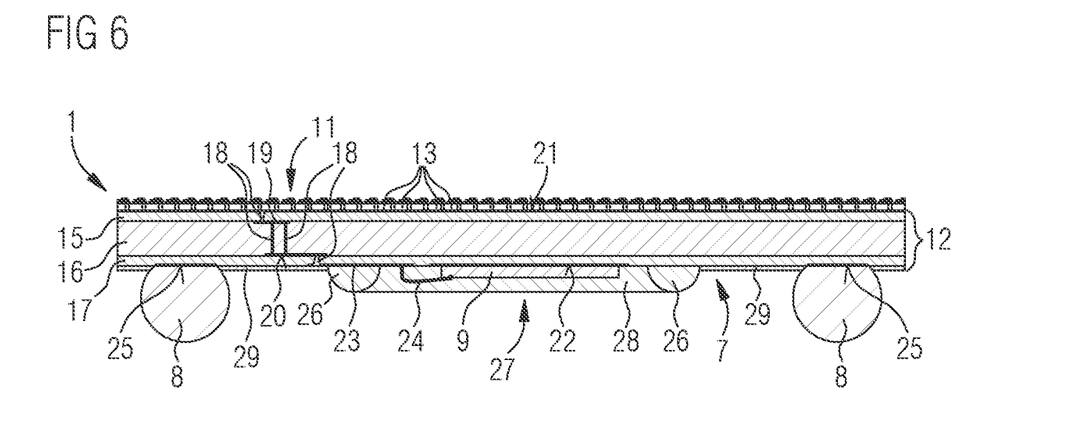
FIG. 6 shows a cross-sectional view of a video-wall module having a circuit chip on the printed-circuit board's bottom face and a frame surrounding the circuit chip.

FIG. 6 shows a cross-sectional view of a further embodiment of a video-wall module 1, wherein on a front face 11 of a printed-circuit board 12 individual light-emitting diode chips 13 are schematically depicted. In addition, the shown printed-circuit board 12 has three layers 15, 16, 17. The layers 15, 16, 17 may be formed from the same or different materials. Moreover, the printed-circuit board 12 comprises electrical through-contacts 18. The drawing only exemplarily shows individual through-contacts 18. In addition, electrically conductive intermediate layers 19, 20 may be provided. The intermediate layers 19, 20 are, e.g., arranged between two layers and are in contact with the through-contacts 18. Moreover, the printed-circuit board 12 comprises electrical conducting pads 21 on the front face 11. By means of the intermediate layers 19, 20 and the through-contacts 18, a re-wiring between the electrical connections of the light-emitting diode chips 13 and electrical contacts on the bottom face 7 of the printed-circuit board 12 may be allowed for in a desired structure. On the bottom face 7 of the printed-circuit board 12, an electrically and/or thermally conductive further conductor surface 22 is arranged. The further conductor surface 22 may comprise a metal or consist of a metal. The circuit chip 9 is arranged on the further conductor surface 22 of the printed-circuit board 12. The further conductor surface 22 may serve to connect electrical contacts, particularly ground contacts of the circuit chips 9 with ground contacts of the light-emitting diode chips 13. For this purpose, electrical through-contacts and/or intermediate layers (not shown) are used. Depending on the used embodiment, the further conductor surface 22 may be dispensed with. In addition, the printed-circuit board 12 comprises conductor lines 23 on the bottom face 7. The electrical conductor lines 23 serve to connect electrical connections of the circuit chip 9 with the electrical connections of the light-emitting diode chips 13 via through-contacts 18 and/or intermediate layers 19, 20. In the shown embodiment, the circuit chip 9 is connected to the conductor lines 23 via wires 24. Depending on the used embodiment, a flip-chip assembly of the circuit chip 9 may be selected instead of the wires 24 and an electrical contacting of the conductor lines 23 may be carried out via contact elements, e.g., in the form of soldered balls.

Furthermore, the printed-circuit board 12 comprises electrical contact surfaces 25 on the bottom face 7, electrical contact elements 8 being arranged on the electrical contact surfaces 25 in the shape of contact balls. The contact balls may, e.g., have a diameter of 0.8 mm. The contact surfaces 25 are connected to electrical contacts of the circuit chip 9 and/or to electrical contacts of the light-emitting diode chips 13 in an electrically conductive manner. In addition, a frame 26 is provided which surrounds the circuit chip 9. The frame 26 is configured with a lateral distance to the outer faces of the circuit chip 9 in a circumferential manner around the circuit chip 9. The frame 26 limits an inner face 27 of the bottom face 7 of the printed-circuit board 12. The circuit chip 9 is arranged on the inner face 27. The inner face 27 is filled up with a casting or a molding material 28, e.g., up to a height of the frame 28. The casting or molding material 28 is depicted in a transparent manner in the figure. The casting or molding material 28 is formed of an electrically insulating material. The casting or molding material 28 may in particular comprise silicone or plastic or consist thereof. By using the frame 26 and the subsequent filling with casting or molding material 28, an inexpensive and reliable covering of the circuit chip 9 may be achieved. The frame 26 may also be formed from an electrically insulating material, in particular plastic, silicone or epoxy material. Furthermore, the printed-circuit board 12 comprises a protective layer 29 on the bottom face 7 in the region in which neither the contact surfaces 25, nor the frame 26, nor the casting and molding material 28 are arranged. The protective layer 29 may, e.g., be formed of a solder resist.

Figure 7:
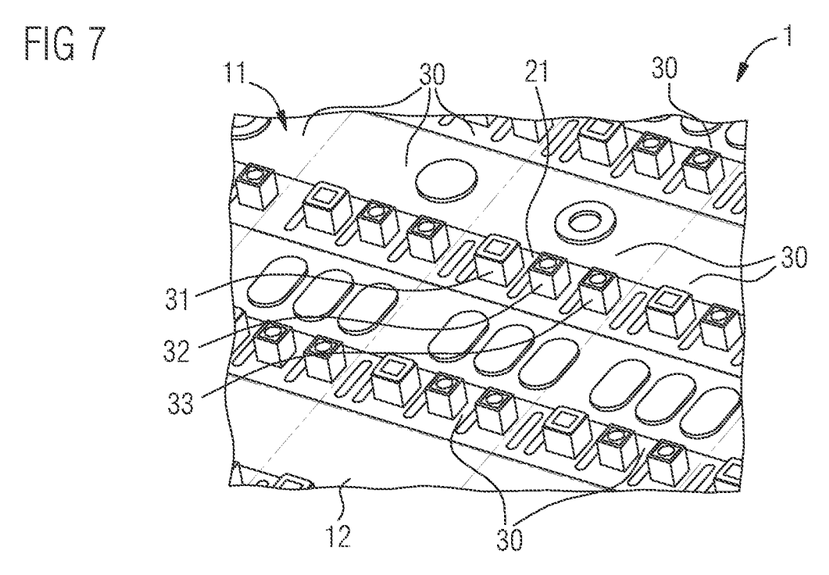
FIG. 7 shows a schematic top view of a section of the video-wall module including a depiction of the light-emitting diode chips.

FIG. 7 shows a schematic partial view of a front face 11 of a printed-circuit board 12 of the video-wall module 1 of FIG. 6, wherein individual pixels 30 are depicted. One pixel 30 is schematically shown being framed by four lines. The pixels 30 are arranged in rows and columns. Each pixel 30 may comprise one or a plurality of light-emitting diode chips 13. In the depicted embodiment, each pixel 30 comprises a first light-emitting diode chip 31 that emits red light. In addition, each pixel 30 comprises a second light-emitting diode chip 32 that emits green light. In addition, each pixel 30 comprises a third light-emitting diode chip 33 that emits blue light. In the depicted embodiment, the light-emitting diode chip 31, 32, 33 are arranged on conducting pads 21 that provide a ground potential. The second electrical connections of the light-emitting diode chips 31, 32, 33 are not explicitly shown. Depending on the used embodiment, the light-emitting diode chips 31, 32, 33 may comprise other kinds of electrical contacts. In addition, the light-emitting diode chips 31, 32, 33 may also comprise a different kind of electrical contacts. In accordance, the electrical contacting of the light-emitting diode chips may be configured differently, as well. The shown embodiment of the front face 11 of the video-wall module 1 may be provided in all described embodiments.

Figure 8:
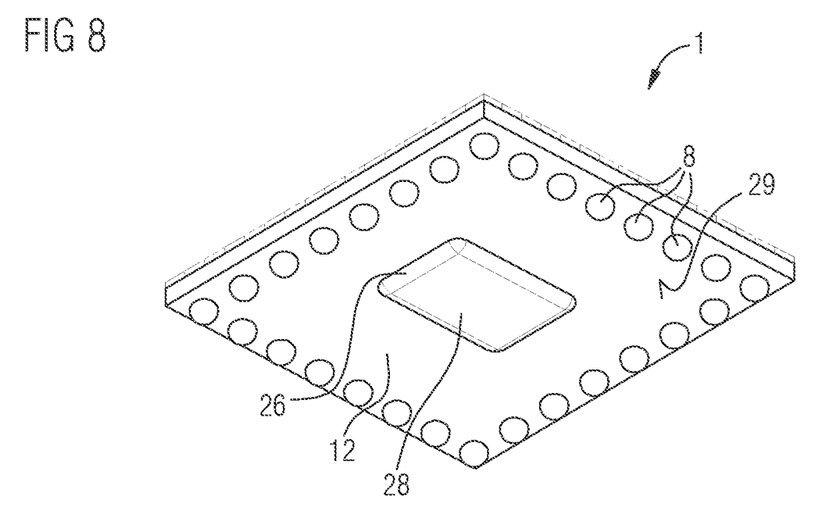
FIG. 8 shows a view of the bottom face of the video-wall module of FIG. 7.

FIG. 8 shows a bottom face 7 of the printed-circuit board 12 of the video-wall module 1 of FIG. 6 in a perspective view.

Figure 9:
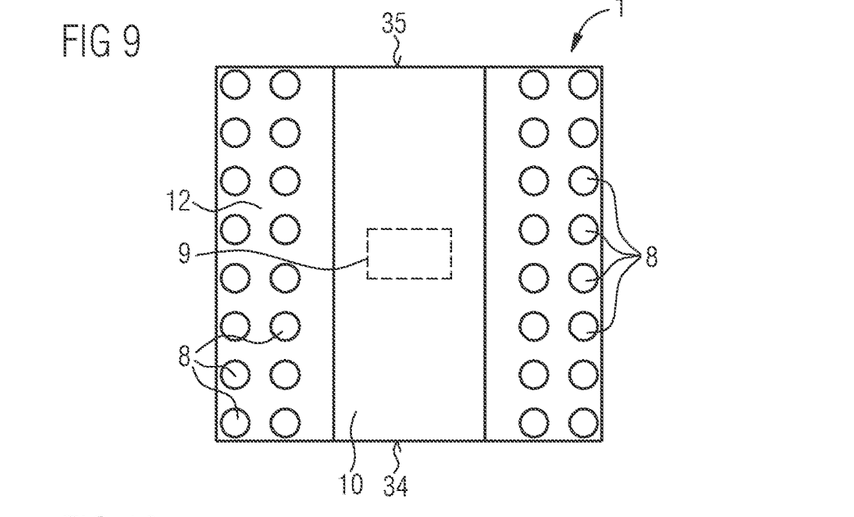
FIG. 9 shows a view of a bottom face of a further video-wall module having a strip-like coating.

FIG. 9 shows a bottom face 7 of a printed-circuit board 12 of a further video-wall module 1, wherein a circuit chip 9 is arranged on the bottom face 7. The circuit chip 9 is indicated by dashed lines. The circuit chip 9 is provided with a coating 10. The coating 10 is embodied as a strip that is guided from a first side 34 to an opposite second side 35 of the printed-circuit board 12. The electrical contact elements 8 are arranged laterally to the coating 10 in parallel rows in this embodiment. Said arrangement allows for depositing the coating 10 on the bottom face 7 of the circuit chip 9 by means of transfer molding.

Figure 10:
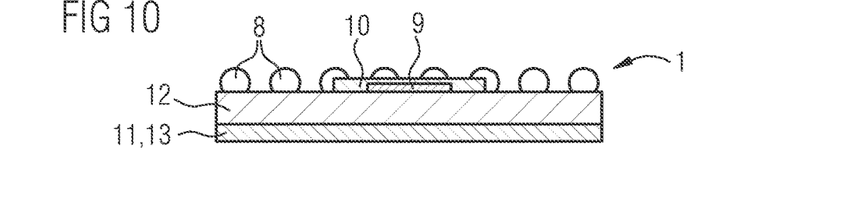
FIG. 10 shows a cross-sectional view of the video-wall module of FIG. 9.

FIG. 10 shows a schematic cross-section through the video-wall module 1 of FIG. 9. Herein, the light-emitting diode chips 13 are arranged on the front face 11.

Figure 11:
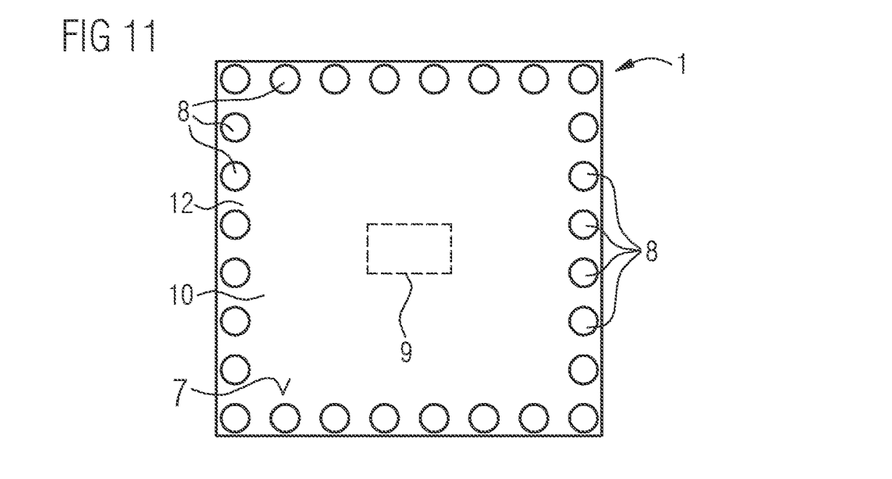
FIG. 11 shows a view of a surface-coated bottom face of a video-wall module.
Figure 12:
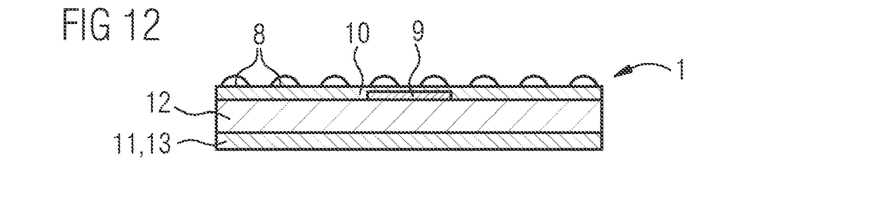
FIG. 12 shows a cross-sectional view of the video-wall module of FIG. 11.

FIG. 11 depicts a view of the bottom side 7 of a printed-circuit board 12 of a video-wall module 1. Said embodiment essentially corresponds to the embodiment of FIGS. 2 and 3, wherein, however, contrary to the embodiment of FIGS. 2 and 3 the coating 10 covers the entire bottom face 7 of the printed-circuit board 12. The coating 10 covers the circuit chip 9 that is indicated by a dashed line. The coating 10, however, is so thin that the electrical contact elements 8 that are configured as contact balls protrude above the coating 10. This is clearly visible in FIG. 12 which shows a cross-section of the video-wall module 1 of FIG. 11. Depending on the used embodiment, the coating 10 may in all embodiment example be deposited as a film. This may be of particular advantage when forming the embodiment of FIG. 11 as the electrical contact elements 8 remain free of film due to corresponding pre-structuring.

Figure 13:
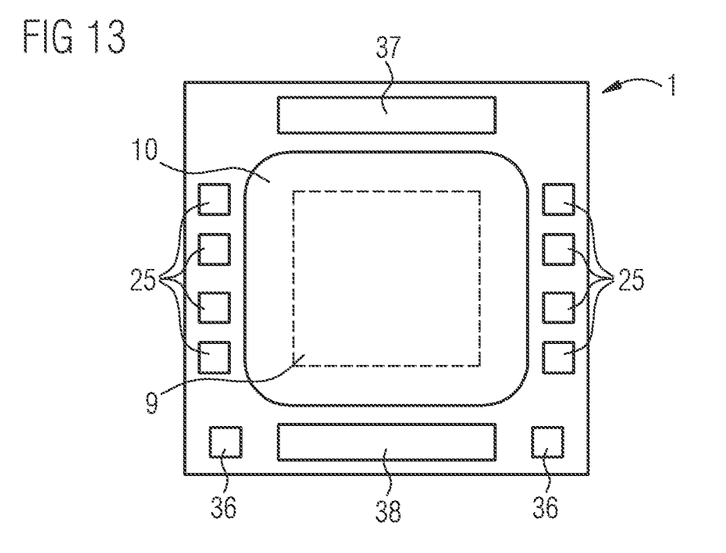
FIG. 13 shows a view of a bottom face of a video-wall module having a large-surface circuit chip.

FIG. 13 shows a further embodiment of a video-wall module 1 with a view of the bottom face 7 of printed-circuit board 12. In this embodiment, electrical contact surfaces 25 are arranged on the bottom face 7. The circuit chip 9 that is shown as a dashed object in this embodiment covers a larger area of the bottom face 7 of the printed-circuit board 12. The circuit chip 9 is provided with a coating 10. In this embodiment, e.g., the multiplexer circuit 2 and the current-supply circuit 3 are integrated in the circuit chip 9. In this manner, the number of contact surfaces 25 may be reduced. In addition, there is the option of providing a plug connection 36 on the bottom face 7 of the printed-circuit board 12. By means of this embodiment, the circuitry of the video-wall module 1 is further reduced. Furthermore, a thermal and/or mechanical connecting region 37, 38 may be provided on opposite faces for a thermal and/or mechanical coupling of the video-wall module 1, e.g., by means of a carrier frame.

Figure 14:
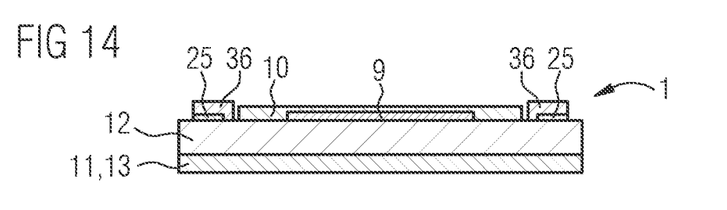
FIG. 14 shows a cross-sectional view of the video-wall module of FIG. 13.

FIG. 14 shows a schematic cross-section of the module of FIG. 13.

Figure 15:
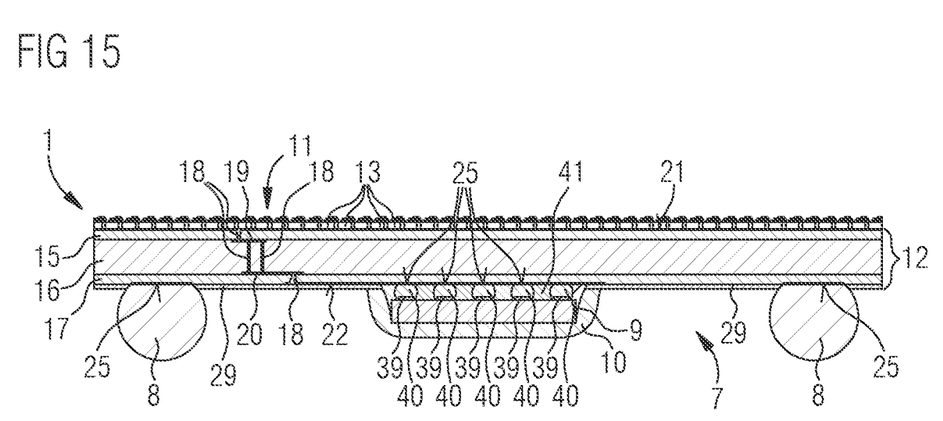
FIG. 15 shows a cross-sectional view of a video-wall module in which the circuit chip is fixed on the bottom face of the video-wall module in a flip-chip assembly.

FIG. 15 shows a cross-sectional view of a further embodiment of a video-wall module 1 that is essentially configured according to the video-wall module of FIG. 6. Contrary to the embodiment of FIG. 6, the circuit chip 9 is electrically contacted by means of a flip-chip assembly on the bottom face 7 of the printed-circuit board 12. For this purpose, the circuit chip 9 has electrical connection pads 39 on a bottom side that is assigned to the bottom face 7 of printed-circuit board 12. The connecting pads 39 are connected to contact surfaces 25 of the printed-circuit board 12 in an electrically conductive manner via contact elements 8. The contact surfaces 25 may be connected with conductor surfaces and/or via through-contacts 18 and intermediate layers 19, 20.

In addition, in a clearance between the circuit chip 9 and the bottom side 7 of the printed-circuit board 12, a thermally conductive layer 41 is configured. The circuit chip 9 may be covered by a coating 10. The circuit chip 9 may be covered by a coating 10. Alternatively, the circuit chip 9 may also be arranged between the printed-circuit board on a further printed-circuit board. Herein, the circuit chip 9 is electrically and mechanically connected to the printed-circuit board 12. In addition, the circuit chip 9 is mechanically connected to the further printed-circuit board. In this embodiment, the housing for the circuit chip 9 is essentially formed by the printed-circuit board 12 and the further printed-circuit board. Moreover, the circuit chip 9 may be electrically connected to the further printed-circuit board.

Depending on the chosen embodiment, the thermally conductive layer 41 and the coating 10 may consist of the same material such as a thermally conductive and electrically insulating plastic or adhesive. The thermally conductive layer 41 may consist of epoxy material. The epoxy material may in a further fuse process in the circuit chip 9 stick to the printed-circuit board. Moreover, the epoxy material absorbs mechanical stress on the solder balls and thus increases operational reliability.

Figure 16:
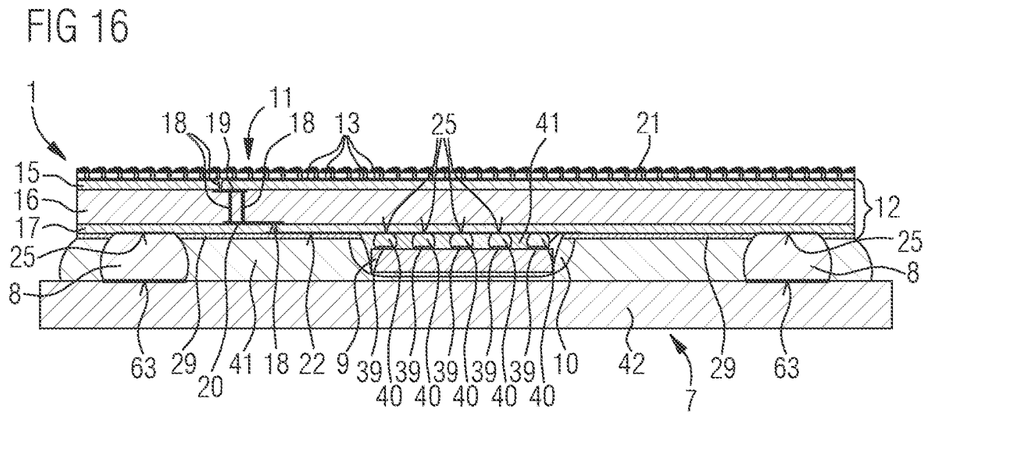
FIG. 16 shows a cross-sectional view of the video-wall module of FIG. 15 that is connected to a further printed-circuit board.

FIG. 16 depicts the video-wall module 1 of FIG. 15, wherein the video-wall module 1 is mounted on a further printed-circuit board 42. A clearance between the bottom face 7 of the printed-circuit board 12 and the further printed-circuit board 42 is filled by a thermally conductive and electrically insulating layer 41. In this way, heat from the video-wall module 1, in particular from the circuit chip 9, may be dissipated to the further printed-circuit board 42 via the thermally conductive layer 41. Furthermore, an electrical connection between contact surfaces 25 of the printed-circuit board 12 and further electrical contacts 63 of the further printed-circuit board 42 is established via electrical contact elements 8. Depending on the used embodiment, the coating 10 may be dispensed with. In this way, the housing is essentially formed by the printed-circuit board 12 and the further printed-circuit board 42. Laterally, the circuit chip 9 may additionally be covered by the thermally conductive layer 41 that may form a part of the housing.

Figure 17:
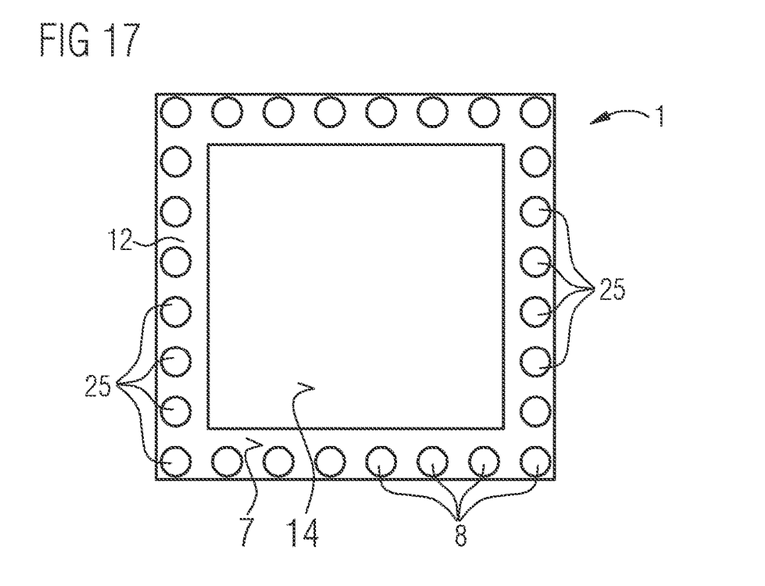
FIG. 17 shows a view of a bottom face of a video-wall module having a thermally conductive layer.

FIG. 17 shows a view of a bottom face 7 of a printed-circuit board 12 of a video-wall module 1, wherein a conductor surface 14 covers the bottom face 7 of the printed-circuit board 12. Electrical contact surfaces 25 are arranged around an edge region of the printed-circuit board 12. The thermally conductive conductor surface 14 covers at least 40%, e.g., at least 60%, particularly at least 80% or more of the bottom face 7 of printed-circuit board 12.

Figure 18:
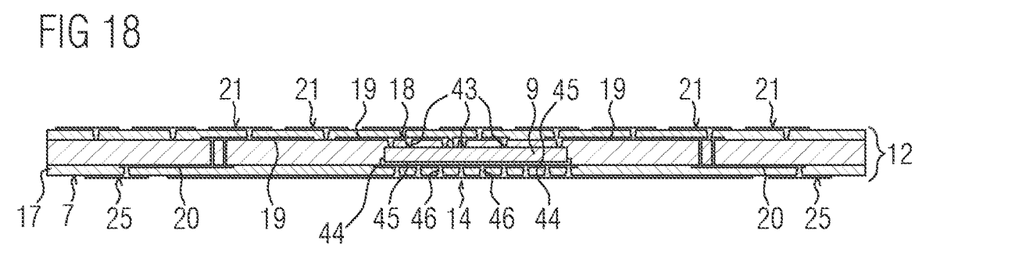
FIG. 18 shows a cross-sectional view of the video-wall module of FIG. 17.

FIG. 18 shows a schematic cross-section of the printed-circuit board 12 of FIG. 17. For this embodiment, the light-emitting diode chips have not been depicted. The printed-circuit board 12 comprises three layers 15, 16, 17. On a front face 11 of the printed-circuit board 12, electrical conductor surfaces 12 are provided. The electrical conductor surfaces 21 serve to electrically contact the light-emitting diode chips. The electrical conducting pads 21 are guided to intermediate layers 19, 20 via electrical through-contacts 18. Furthermore, the intermediate layers 19, 20 are, via through-contacts 18, connected to electrical contact surfaces 25 arranged on the bottom face of the printed-circuit board 12. The circuit chip 9 is completely integrated into the printed-circuit board 12. In the shown embodiment, the circuit chip 9 is arranged in the middle, i.e., in the second layer 16. Depending on the chosen embodiment, the circuit chip 9 may also be arranged in the first or third layer 15, 17, or, respectively, extend over the first, second and/or third layer 15, 16, 17. On an upper face, the circuit chip 9 comprises first connection contacts 43 that are connected in an electrically conductive manner to the conducting pads 21 and/or to the electrical contact surfaces 25 via through-contacts 18. Furthermore, a thermally conductive intermediate layer 44 is arranged in the printed-circuit board 12, in particular on the third layer 17 in the region of the circuit chip 9. The thermally conductive intermediate layer 44 may cover a part of the area of the circuit chip 9 or the entire area of the circuit chip 9. In addition, the thermally conductive intermediate layer 44 may laterally protrude over the area of the circuit chip 9 is going to be. The larger the area of the thermally conductive intermediate layer 44, the better the heat dissipation from the circuit chip 9. The thermally conductive intermediate layer 44 may consist of metal, in particular copper, or of a metal, particularly copper. The intermediate layer 44 may only cover a part of the area of the third layer 17. The circuit chip 9 is either directly connected to the thermally conductive intermediate layer 44 or via a thermally and/or electrically conductive connecting layer 45. The thermally conductive intermediate layer 44 may also be electrically conductive. The connecting layer 45 may also be an electrically and/or thermally conductive adhesive. The connecting layer may consist of a silver conductive adhesive. Furthermore, the thermally conductive intermediate layer 44 is connected with the conductor surface 14 in an electrically and/or thermally conductive manner via further through-contacts 46. The conductor surface 14 is arranged on the bottom face 7 of the printed-circuit board 12. The larger the conductor surface 14, the better is the heat dissipation. In addition, the thermal and electrical coupling is better the more further electrical through-contacts 46 are provided.

Figure 19:
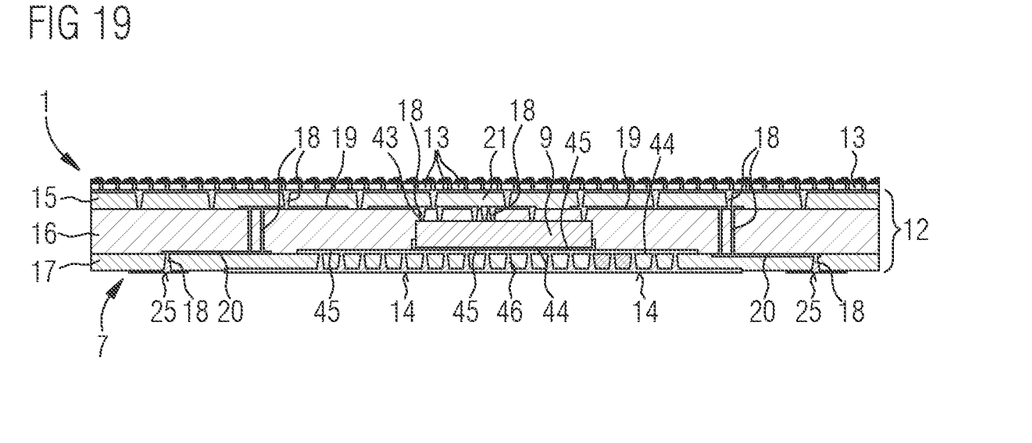
FIG. 19 shows a cross-sectional view of a video-wall module having an LGA arrangement.

FIG. 19 shows a cross-section of the video-wall module 1 comprising a printed-circuit board 12 and a circuit chip 9, wherein the video-wall module 1 is essentially embodied according to the embodiment of FIG. 18. The video-wall module 1 differs from the embodiment of FIG. 18 in that the thermally conductive intermediate layer 44 comprises a larger area than the circuit chip 9. For example, the circuit chip 9 may be arranged in the center of the thermally conductive intermediate layer 44. In this manner, an improved heat dissipation from the circuit chip 9 is achieved on the conductor surface 14. Due to the larger area of the thermally conductive intermediate layer 44, more and/or cross-sectionally larger further through-contacts 46 may be provided. The further through-contacts 46 connect the thermally conductive intermediate layer 44 with the conductor surface 14. Hence, the video-wall module 1 of FIG. 19 has an LGA (Land Grid Array). When forming an LGA component, soldering paste is deposited and subsequently connected to the further printed-circuit board in a reflow-soldering process. The soldering paste has the advantage that it is usually cheaper than solder balls. Furthermore, the soldering paste may be thinner as a soldering layer, thus allowing for better heat dissipation. Hence, the LGA embodiment may provide better heat integration than the BGA version.

Figure 20:
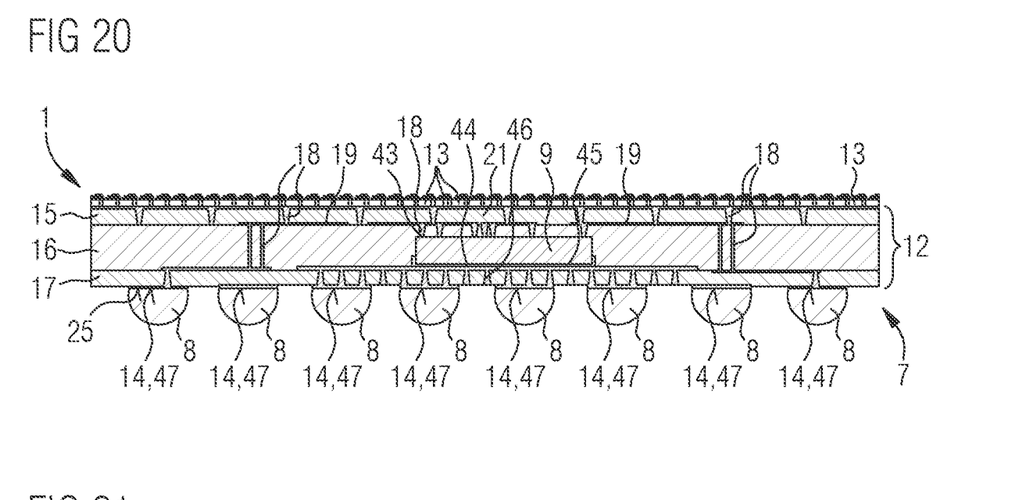
FIG. 20 shows a cross-sectional view of a video-wall module having an BGA arrangement.

FIG. 20 shows a similar embodiment of a video-wall module 1 in cross-section as FIG. 19. Contrary to the embodiment of FIG. 19, the conductor surface 14 is divided up into individual partial areas 47, wherein an electrical contact element 8 in the shape of a contact ball is respectively arranged on a partial area 47. By using a BGA component, a distance to the further printed-circuit board is achieved that may favorably influence reliability. In addition, a solder deposition during assembly with the further printed-circuit board is dispensed with.

Figure 21:
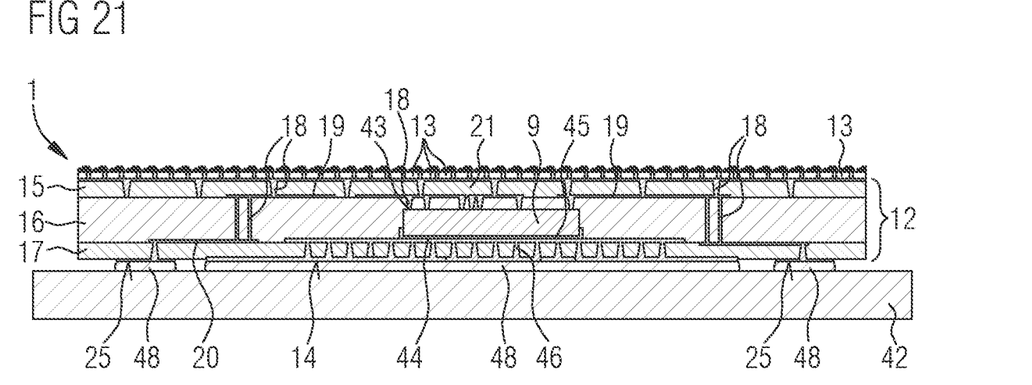
FIG. 21 shows a cross-sectional view of a video-wall module that is connected to a further printed-circuit board.

FIG. 21 shows a video-wall module 1 of FIG. 19 that is electrically and/or thermally connected to a further printed-circuit board 42 via conducting layers 48, e.g., formed of solder material. Thereby, the electrical contact surfaces 25 as well as the conductor surface 14 are mechanically, electrically and thermally connected to the further printed-circuit board 42, in particular with electrical contacts of the further printed-circuit board 42, via conducting layers 48.

Figure 22:
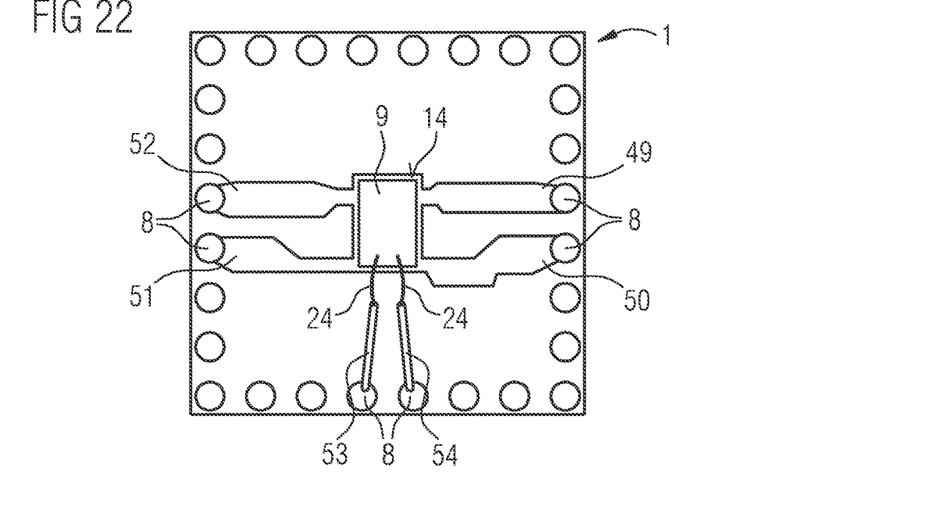
FIG. 22 shows a view of a bottom face of a video-wall module having thermally improved conductor lines.

FIG. 22 shows a view of a bottom face 7 of a printed-circuit board 12 of a video-wall module 1. In this embodiment, the coating covering the circuit chip 9 is not depicted. The circuit chip 9 is arranged on a further electrically conductive conductor surface 22. The further conductor surface 22 is arranged on the bottom face 7 of the printed-circuit board 12. Moreover, in the depicted embodiment four conductor lines 49, 50, 51, 52 originating from the further conductor surface 22 are guided outwards in the direction of the electrical contact elements 8. In the shown embodiment, two conductor lines 49, 50, 51, 52 are respectively guided out of the conductor surface 22 on opposite side faces. The object of the conductor lines 49, 50, 51, 52 is on the one hand to establish an electrical contact with the electrical contact elements 8. For example, a ground potential may be guided to the circuit chip 9 via the electrical contact elements 8 by means of the conductor lines 49, 50, 51, 52. In addition, the conductor lines 49, 50, 51, 52 serve to better dissipate heat from the circuit chip 9. For this reason, the conductor lines 49, 50, 51, 52 have a larger width than other conductor lines. The first, second, third and/or fourth conductor line 49, 50, 51, 52 may have a width in the region of 5% or more of a longitudinal face of the circuit chip 9.

The video-wall module 1 may have the same design as in the above-described embodiments. By way of example, further conductor lines 53, 54 are shown that are in electrical contact with further electrical contacts of circuit chip 9 via wires 24. The further conductor lines 53, 54 have a smaller width and/or a smaller layer thickness than the first, second, third and/or fourth conductor line 49, 50, 51, 52. The further conductor lines 53, 54 may have a width that is at least 30%, particularly 50%, less than the width of the first, second, third and/or fourth conductor line 49, 50, 51, 52.

For example, this may achieve that the temperature on the front side 11 varies over the entire width or length of the video-wall module by less than 10% in the area of the light-emitting diode chips 13. Depending on the thickness of the conductor lines 49, 50, 51, 52 and the width of the conductor lines 49, 50, 52, 52, a further improvement of the uniform heat distribution may be achieved. In particular, the temperature of the video-wall module 1 may vary on the front face 11 by less than 5% over the entire width and/or length.

Figure 23:
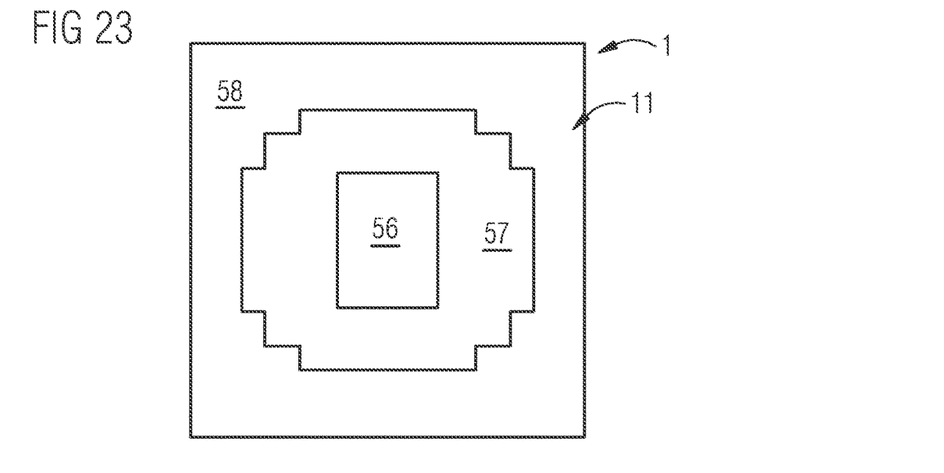
FIG. 23 shows a schematic view of a division of a video-wall module's upper face into regions comprising light-emitting diode chips having differing wavelengths.

FIG. 23 shows a view of a front side 11 of a video-wall module 1 on which the light-emitting diode chips 13 are arranged. If a video-wall module 1 has differing temperature ranges, it may be of advantage to provide different light-emitting diode chips in different temperature ranges. As an example, a first area 56 is shown as a square in the center of front face 11. The first area 56 is surrounded by a first edge area 57. The first edge area 57 is surrounded by a second edge area 58. The first area 56 has a higher average temperature during operation of the video-wall module 1 than the first edge area 57. The first edge area 57 has a higher average temperature during operation of the video-wall module 1 than the second edge area 58. In the first area 56, in the first edge area 57 and the second edge area 58, light-emitting diode chips are arranged that on average have differing wavelengths. For example, in the first area 56 light-emitting diode chips may be arranged that on average have a lowest predetermined wavelength. In the first edge area 57, light-emitting diode chips are arranged that on average have a larger wavelength than the first light-emitting diode chips in the first area 56. In the second edge area 58, third light-emitting diode chips are arranged than on average have larger wavelength than the second light-emitting diode chips in the middle area.

The first, second and third light-emitting diode chips may emit the same color. For example, the first, second and third light-emitting diode chips may emit red or blue or green light. For example, the first light-emitting diode chips emitting red light may on average have a wavelength that is shorter by 1.5 nm than the second light-emitting diode chips of the second edge area 58 at the same temperature, i.e., e.g., prior to the assembly onto the video-wall module. In addition, the second light-emitting diode chips of the first edge area 57 may have a wavelength that, at the same temperature, i.e., in case of, e.g., an assembly onto the video-wall module is smaller by 0.8 nm than the wavelength of the second light-emitting diode chips of the second edge area 58.

Analogously, the first second and third light-emitting diode chips may also emit blue light. For example, first blue light-emitting diode chips may be arranged in the first area 56 that have a wavelength shorter by 0.8 nm than blue light-emitting diode chips of the second edge area 58. In addition, blue light-emitting diode chips may be arranged in the first edge area 57 that have a wavelength shorter by 0.4 nm on average than the blue light-emitting diode chips of the second edge area 58.

Analogously, green light-emitting diode chips may be arranged in the three areas 56, 57, 58 that on average have wavelengths of differing length in the three areas.

The wavelengths of the light-emitting diode chips are chosen such that the wavelength shift may be balanced or, respectively, reduced by the differing temperatures in the center area 56, the first edge area 57 and the second edge area 58. In this manner, in spite of the areas with differing temperatures over the area of the video-wall module 1, a video-wall module 1 may be provided that has a low average color scatter.

Depending on the used embodiment, only two areas or more than three areas may be provided in which light-emitting diode chips of the same color have differing wavelengths.

In a simple embodiment, the video-wall module 1 only has red light-emitting diode chips, green light-emitting diode chips or blue light-emitting diode chips. In an embodiment, the video-wall module 1 respectively has red and blue or blue and green or red and green light-emitting diode chips. In all further embodiments, the video-wall module 1 comprises light-emitting diode chips with two differing colors, respectively, in the center area 56, the first edge area 57 and the second edge area 58. In addition, the video-wall module 1 may comprise two or three light-emitting diode chips of different colors in the center area 56, the first edge area 57 and the second edge area 58, as well.

Depending on the chosen embodiment, the center area 56, the first edge area 57 and the second edge area 58 of the light-emitting diode chips may have different configurations with different colors.

Figure 24:
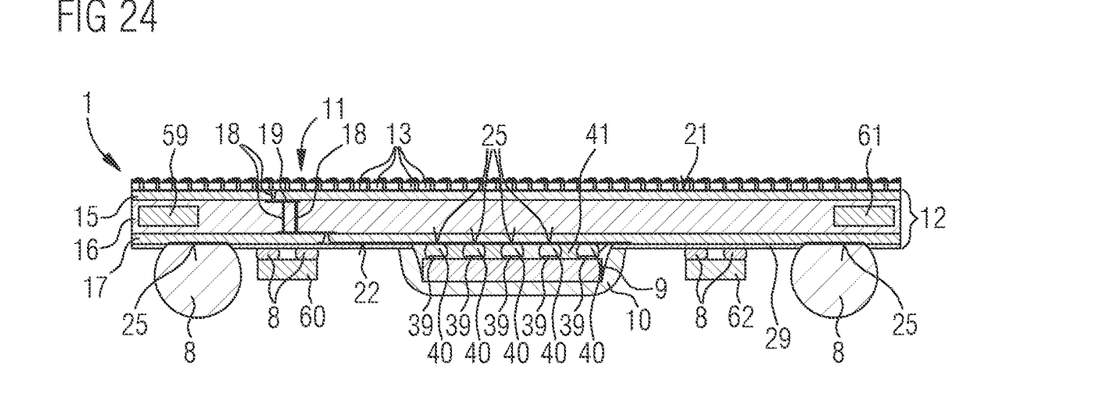
FIG. 24 shows a cross-sectional view of a video-wall module having thermal elements for cooling and heating.

FIG. 24 shows a schematic cross-section of the video-wall module 1 in which either the circuit chip 9 is integrated in the printed-circuit board 12 or mounted to the bottom face 7 of the printed-circuit board 12, as shown. The type of arrangement and/or of thermal connection of the circuit chip 9 may be embodied according to one of the previously described embodiments. In the shown embodiment, the printed-circuit board 12 comprises thermal elements 59, 60, 61, 52 that may be heating elements 59, 60 or cooling elements 61, 62. The heating element may, e.g., be a thermal resistor and the cooling element a Peltier element.

In the shown embodiment, a first heating element 59 is integrated into the printed-circuit board 12, in particular into the second layer 16 of the printed-circuit board 12. A second heating element 60 is arranged on the bottom face 7 of the printed-circuit board and connected with the printed-circuit board 12 in a thermally conductive manner, e.g., by means of solder material. The first and second heating element 59, 60 may, e.g., be configured as thermal resistors. In addition, a first cooling element 61 is provided that is integrated in the printed-circuit board 12, particularly in the second layer 16. Furthermore, a second cooling element 62 is provided that is mounted on the bottom face 7 of printed-circuit board 12. The first and the second cooling element 61, 62 may, e.g., be configured as Peltier elements. The electrical conductors of the thermal elements are not shown.

Depending on the chosen embodiment, the printed-circuit board may comprise only one of the heating and/or only one of the cooling elements. The heating elements 59, 60 and the cooling elements 61, 62 may be actuated in a manner to increase or reduce temperature in a local area of the printed-circuit board or, respectively of the video-wall module. In this manner, a more uniform temperature may in total be set for the light-emitting diode chips 13 over the entire area of the video-wall module. Actuating the heating or cooling elements may be previously determined in experiments or monitored and controlled by means of temperature sensors. The heating elements 59, 60 and/or cooling elements 61, 62 may be arranged accordingly depending on the existing temperature distribution in order to achieve lower average temperature distribution.

The through-contacts 18, 46 may, e.g., be mechanically drilled or laser-drilled. In addition, the manufactured printed-circuit board may have a size in the range of 70×125 mm. Moreover, several, e.g., 25 video-wall modules, may be arranged on a manufactured printed-circuit board.

Embodiments of the present invention deal with the object of integrating circuit chips in a video-wall module. As circuit chips generate heat, a thermal load of the light-emitting diode chips may increase. Moreover, an irregular temperature may be set over the video-wall module due to the arrangement of the circuit chip directly at or in the printed-circuit board of the video-wall module. Depending on the range of the temperature differences, same types of light-emitting diode chips may emit differing wavelengths due to temperature differences. This may generate an inhomogeneous color appearance of the video-wall module. This disadvantage may be balanced by using light-emitting diode chips with shorter wavelengths in the warmer areas of the video-wall module. Contrary to this, light-emitting diode chips with larger wavelengths are used in cold areas of the video-wall module.

By integrating the circuit chips, i.e., the electronics into the video-wall module, the number of electrical contacts with the outside may be reduced. The less electrical contacts are present, the larger the configuration of the electrical contacts may become. Moreover, the reliability of the video-wall module increases with the sinking number of electrical contacts. Moreover, the amount of wiring is reduced when assembling the video-wall module. Furthermore, a number of layers of the further printed-circuit board may in this manner be reduced. In addition, assembly of the circuit chips on the video-wall module becomes less complex as the circuit chip is already mounted. As the circuit chips do not have a dedicated housing, design space may be saved.

In addition, a specific circuit chip may be assigned to each video-wall module depending on individual properties such as brightness and wavelength. In the circuit chip, the information on brightness and wavelength may be taken over from a test measurement and saved in the circuit chip. By means of this data, new calibration measurements during further assembly of the video module may be dispensed with. Moreover, due to the short conductor paths between the light-emitting diode chips and the circuit chip, parasitic resistances, capacities and/or inductivities may be reduced.

Depending on the chosen embodiment, a video-wall module, e.g., comprises 8×8 pixels, wherein each pixel comprises a red, a green and a blue light-emitting diode, i.e., light-emitting diode chip. Anode conduction of the light-emitting diode chips may be addressed sequentially. The currents of 8×3 light-emitting diode chips flow over the transistor in the multiplexer as eight columns each having three light-emitting diode chips are provided. As a result, an area required for this transistor is relatively large. Via a data bus, the multiplexer receives the information which row is to emit light at the moment. The data are provided by a microcontroller or graphics processor. Furthermore, a constant-current-source array is provided that generates a programmable constant current for each column at the cathode, the current determining the brightness of the pixel.

Depending on the chosen embodiment, a heat may be generated during operation of the constant-current-source array in the circuit chip and in the light-emitting diode chip that is in the range between 30 mW and 34 W. A typical value is in the range of 190 mW for a 16×16 pixel video-wall module with a pixel size of 1 mm and a luminance of 2000 cd/m$^2$.

Depending on the demands to color homogeneity, a wavelength difference of >0.5 nm may already negatively influence color appearance.

A printed-circuit board may, e.g., be a multi-layer printed-circuit board. The multi-layer printed-circuit board is constructed layer-by-layer and, e.g., comprises metal films, particularly copper films, prepregs and a core comprising carrier material. The layered design of the printed-circuit board may be mirror-symmetrical with regard to the inner layer, i.e., the core. The inner layer consists of a carrier material such as metal and may have a thickness between 0.10 mm and 1.20 mm. The inner layer is on both sides covered by at least one prepreg layer and a metal film.

Prepregs are electrically insulating. Between the individual layers of metal, two prepregs layers may respectively be deposited. Thicker prepregs provide higher stability. Prepregs are textile fiber-matrix semi-finished products pre-impregnated with reactive resins that are cured by means of temperature and pressure in order to manufacture printed-circuit boards. As fibers, glass fibers may be used. The embodiments of the printed-circuit boards described in the present application may be produced from layers laminated on top of one another. Moreover, electrical through-contacts may be provided between the metal films, i.e., the metal layers, the through-contacts connecting at least two metal layers with each other.

The invention claimed is:

1. A video-wall module comprising:
   a printed-circuit board;
   a plurality of first and second light-emitting diode chips arranged at the printed-circuit board;
   a circuit chip fixed to the printed-circuit board, wherein the circuit chip is connected to electrical connections of the first and second light-emitting diode chips in order to electrically actuate the first and second light-emitting diode chips; and
   a housing for the circuit chip at least partially formed by the printed-circuit board,
   wherein the first and second light-emitting diode chips are divided into a first area and a first edge area surrounding the first area,
   wherein the first light-emitting diode chips in the first area are configured to emit light with a smaller radiation wavelength than the second light-emitting diode chips in the first edge area on average when operated with the same temperature, and
   wherein the first light-emitting diode chips of the first area are configured to emit light with the same color as the second light-emitting diode chips of the first edge area when the first area is operated with a higher average temperature than the first edge area.

2. The video-wall module according to claim 1, wherein the circuit chip is arranged on a bottom face of the printed-circuit board within the first area, wherein the circuit chip is covered by a coating, and wherein the coating and the printed-circuit board form the housing for the circuit chip.

3. The video-wall module according to claim 2, further comprising a frame arranged on the bottom face of the printed-circuit board, wherein the frame surrounds an inner face of the bottom face, wherein the circuit chip is arranged on the inner face, and wherein the inner face is filled with a casting or molding material, the casting or molding material forming the coating.

4. The video-wall module according to claim 2, wherein the circuit chip is mounted to the bottom face of the printed-circuit board in a flip-chip assembly, wherein electrical contacts of the circuit chip are connected to electrical contacts of the printed-circuit board via contact elements, and wherein a thermally conductive layer is arranged between the circuit chip and the bottom face of the printed-circuit board.

5. The video-wall module according to claim 2, wherein the printed-circuit board comprises a further conductor surface on the bottom face, wherein the circuit chip is arranged on the further conductor surface, wherein at least two conductor lines are guided from the further conductor surface to an edge region of the bottom face of the printed-circuit board, wherein one of the conductor lines is respectively connected to an electrical contact surface and/or to a contact element of the printed-circuit board, and wherein the electrical contact surfaces and/or contact elements are arranged on the bottom face of the printed-circuit board.

6. The video-wall module according to claim 5, wherein the conductor lines originate on sides of the further conductor surface arranged opposite to one another, and wherein the two conductor lines are guided to electrical contact surfaces and/or contact elements at opposite edges of the printed-circuit board.

7. The video-wall module according to claim 1, wherein the circuit chip is arranged within the first area in the printed-circuit board, and wherein the printed-circuit board forms the housing for the circuit chip.

8. The video-wall module according to claim 7, further comprising a thermally conductive intermediate layer arranged in the printed-circuit board, wherein the circuit chip is thermally coupled with the intermediate layer, wherein further thermally conductive through-contacts are provided in the printed-circuit board, and wherein the further through-contacts are guided to a bottom face of the printed-circuit board in the intermediate layer.

9. The video-wall module according to claim 1, wherein the printed-circuit board comprises a thermally conductive layer at a bottom face configured to dissipate heat from the circuit chip.

10. The video-wall module according to claim 1,
    wherein the first light-emitting diode chips of the first area and the second light-emitting diode chips of the first edge area are configured to emit red light, and/or
    wherein the first light-emitting diode chips of the first area and the second light-emitting diode chips of the first edge area are configured to emit blue light, and/or
    wherein the first light-emitting diode chips of the first area and the second light-emitting diode chips of the first edge area are configured to emit green light.

11. The video-wall module according to claim 1, wherein the printed-circuit board comprises a controllable thermal element, and wherein the thermal element is configured to increase or to reduce a temperature of the printed-circuit board in a predetermined region in order to balance temperature differences on the printed-circuit board that are caused by waste heat of the circuit chip.

12. The video-wall module according to claim 11, wherein the thermal element is a controllable heat sink configured to reduce a temperature of the printed-circuit board in a predetermined region.

13. The video-wall module according to claim 11, wherein the thermal element is a controllable heat source configured to increase a temperature of the printed-circuit board in a predetermined region.

14. The video-wall module according to claim 1, wherein the first light-emitting diode chips of the first area are configured to emit at the same temperature on average light with a wavelength that is up to 1.5 nm shorter than a wavelength of the light that is emitted by the second light-emitting diode chips of the first edge area.

15. The video-wall module according to claim 1, wherein the first light-emitting diode chips of the first area are configured to emit at the same temperature on average light with a wavelength that is up to 0.7 nm shorter than a wavelength of the light that is emitted by the second light-emitting diode chips of the first edge area.

16. The video-wall module according to claim 1, wherein the first light-emitting diode chips of the first area are configured to emit at the same temperature on average light with a wavelength that is up to 0.4 nm shorter than a wavelength of the light that is emitted by the second light-emitting diode chips of the first edge area.

17. The video-wall module according to claim 1, wherein the first light-emitting diode chips of the first area and the second light-emitting diode chips of the first edge area are chosen such with regard to wavelengths of the first and second light-emitting diode chips that a wavelength shift caused by different temperatures in the first area and in the first edge area are balanced or respectively, reduced, and wherein during operation the first light-emitting diode chips of the first area and the second light-emitting diode chips of the first edge area emit light with the same color.

18. The video-wall module according to claim 1, wherein the first light-emitting diode chips of the first area and the second light-emitting diode chips of the first edge area are types of light-emitting diode chips that emit differing wavelengths due to temperature differences, wherein the differing wavelengths are balanced by using the first light-emitting diode chips with shorter wavelengths in the warmer first area and using the second light-emitting diode chips with larger wavelengths in colder first edge area, wherein during operation the first light-emitting diode chips of the first area and the second light-emitting diode chips of the first edge area emit light with the same color.

19. A video-wall module comprising:
a printed-circuit board;
a plurality of light-emitting diode chips arranged at the printed-circuit board;
a circuit chip fixed to the printed-circuit board, wherein the circuit chip is connected to electrical connections of the light-emitting diode chips in order to electrically actuate the light-emitting diode chips;
a housing for the circuit chip at least partially formed by the printed-circuit board,
wherein the light-emitting diode chips are divided into a first area and a first edge area surrounding the first area, and
wherein the light-emitting diode chips in the first area are configured to emit light with a smaller radiation wavelength than the light-emitting diode chips in the first edge area on average at the same temperature; and
a second edge area surrounding the first edge area, wherein the light-emitting diode chips on average are configured to emit light with a smaller radiation wavelength in the first edge area than the light-emitting diode chips in the second edge area at the same temperature.

20. A method for producing a video-wall module, the method comprising:
fixing a circuit chip to a printed-circuit board, wherein the circuit chip is connected to electrical connections of first and second light-emitting diode chips in order to electrically actuate the first and second light-emitting diode chips; and
forming a housing for the circuit chip, wherein the housing is at least partially formed by the printed-circuit board;
arranging the first light-emitting diode chips in a first area on the printed-circuit board; and
arranging the second light-emitting diode chips in a first edge area on the printed-circuit board,
wherein the first edge area surrounds the first area on the printed-circuit board,
wherein the first light-emitting diode chips are configured to emit light with a smaller radiation wavelength than the second light-emitting diode chips when operated at the same temperature, and
wherein the first light-emitting diode chips are configured to emit light with the same color as the second light-emitting diode chips of when the first area is operated with a higher average temperature than the first edge area.

* * * * *